United States Patent
Chen

(10) Patent No.: US 11,983,417 B2
(45) Date of Patent: May 14, 2024

(54) POWER-ON READ CIRCUIT

(71) Applicant: Winbond Electronics Corp., Taichung (TW)

(72) Inventor: Chung-Zen Chen, Taichung (TW)

(73) Assignee: Winbond Electronics Corp., Taichung (TW)

( * ) Notice: Subject to any disclaimer, the term of this patent is extended or adjusted under 35 U.S.C. 154(b) by 65 days.

(21) Appl. No.: 17/989,661

(22) Filed: Nov. 17, 2022

(65) Prior Publication Data
US 2023/0214131 A1 Jul. 6, 2023

(30) Foreign Application Priority Data
Jan. 4, 2022 (TW) .................................. 111100235

(51) Int. Cl.
*G06F 3/06* (2006.01)
(52) U.S. Cl.
CPC .......... *G06F 3/0619* (2013.01); *G06F 3/0653* (2013.01); *G06F 3/0679* (2013.01)
(58) Field of Classification Search
CPC .... G06F 3/0619; G06F 3/0653; G06F 3/0679; G11C 5/145; G11C 5/147; G11C 16/32; G11C 16/30; G11C 16/26
See application file for complete search history.

(56) References Cited

U.S. PATENT DOCUMENTS

| 7,920,439 B2 | 4/2011 | Kumazaki | |
|---|---|---|---|
| 9,466,391 B2* | 10/2016 | Hong | G11C 17/16 |
| 2015/0162094 A1* | 6/2015 | Kim | G11C 17/16 365/96 |
| 2020/0026666 A1* | 1/2020 | Ju | G06F 12/1475 |
| 2020/0168272 A1* | 5/2020 | Ji | G11C 16/3495 |
| 2024/0071440 A1* | 2/2024 | Mason | G11C 7/222 |

FOREIGN PATENT DOCUMENTS

TW I702796 8/2020

* cited by examiner

*Primary Examiner* — Hiep T Nguyen
(74) *Attorney, Agent, or Firm* — JCIPRNET

(57) ABSTRACT

A power-on read circuit includes a power voltage detector, a first voltage booster, a voltage selector, a reference voltage generator and a read voltage generator. The power voltage detector detects a power voltage to generate a control signal. The first voltage booster generates a first boosted voltage according to the control signal. The voltage selector selects the power voltage or the first boosted voltage to generate a selected voltage. The reference voltage generator receives the selected voltage as an operating power source, and generates a reference voltage based on the selected voltage according to the control signal. The read voltage generator generates a second boosted voltage according to the reference voltage and a clock signal, and generate a read voltage based on the second boosted voltage according to the control signal. The read voltage is provided to a memory cell array to perform a data reading operation.

18 Claims, 4 Drawing Sheets

POWER-ON READ CIRCUIT

CROSS-REFERENCE TO RELATED APPLICATION

This application claims the priority benefit of Taiwan application serial no. 111100235 filed on Jan. 4, 2022. The entirety of the above-mentioned patent application is hereby incorporated by reference herein and made a part of this specification.

BACKGROUND

Technical Field

The disclosure relates to a power-on read circuit, and more particularly relates to a power-on read circuit that operates normally at a low power voltage.

Description of Related Art

In flash memory products, there are some memory cells that exist to store specific data. The specific data must be read during power on. Generally, during the power-on reading operation, a suitable read voltage may be applied to ensure that the correct data is read.

The aforementioned read voltage is usually generated according to the reference voltage. In the power-on process of the power voltage, the voltage value of the reference voltage may not be accurately controlled. Consequently, the read voltage may not be correctly generated. Therefore, there is often a concern that the data read by the power-on reading operation might be incorrect.

SUMMARY

The disclosure provides a power-on read circuit that operates normally under low power voltage conditions.

The power-on read circuit of the disclosure includes a power voltage detector, a first voltage booster, a voltage selector, a reference voltage generator, and a read voltage generator. The power voltage detector detects a voltage value of a power voltage to generate a control signal. The first voltage booster generates a first boosted voltage according to the control signal. The voltage selector selects the power voltage or the first boosted voltage to generate a selected voltage. The reference voltage generator receives the selected voltage as an operating power source, and generates a reference voltage based on the selected voltage according to the control signal. The read voltage generator generates a second boosted voltage according to the reference voltage and a clock signal, and generates a read voltage based on the second boosted voltage according to the control signal. The read voltage is provided to a memory cell array to perform a data reading operation.

Based on the above, the power-on read circuit of the disclosure may provide a boosted voltage through a voltage booster as a basis for generating a reference voltage during the power-on process of the power voltage. Subsequently, according to the reference voltage, the read voltage generator may generate another boosted voltage, and generate the read voltage based on the boosted voltage. In this way, the data reading operation of the memory cell array may be effectively performed.

DETAILED DESCRIPTION OF DISCLOSED EMBODIMENTS

Figure 1:
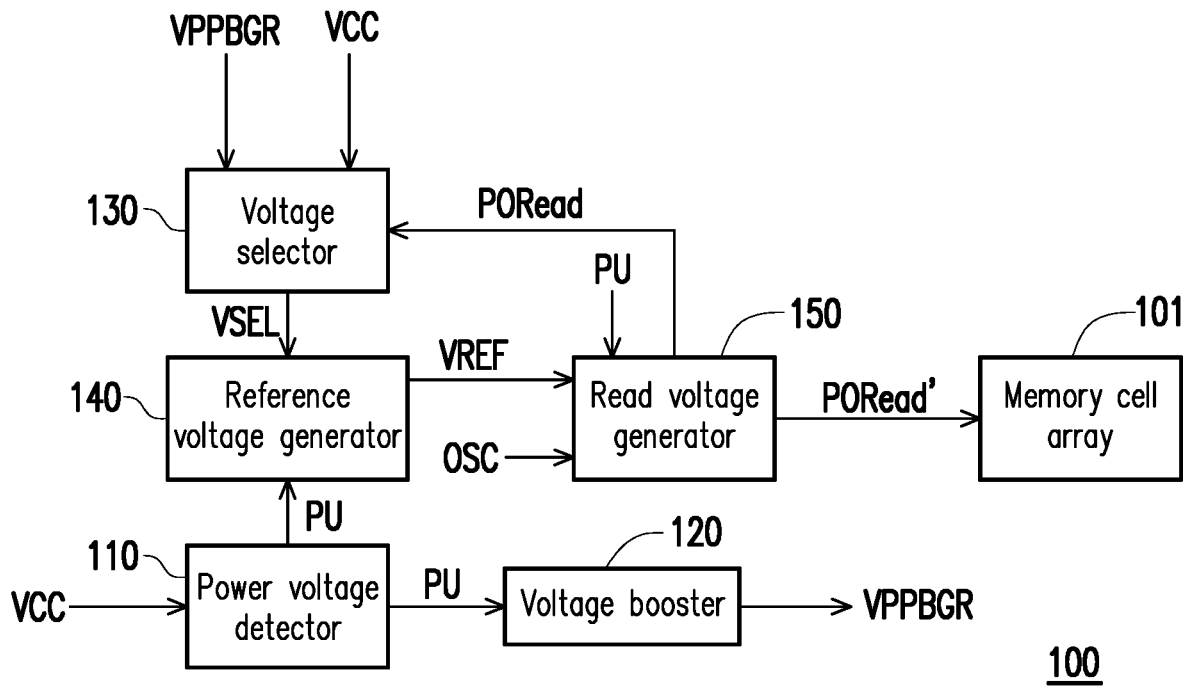
FIG. 1 is a block diagram of a power-on read circuit according to an embodiment of the disclosure.

Referring to FIG. 1, FIG. 1 is a block diagram of a power-on read circuit according to an embodiment of the disclosure. The power-on read circuit 100 is configured to perform a data reading operation on a memory cell array 101 during the power-on process of the power voltage VCC. The power-on read circuit 100 includes a power voltage detector 110, a voltage booster 120, a voltage selector 130, a reference voltage generator 140, and a read voltage generator 150. The power voltage detector 110 is configured to detect the voltage value of the power voltage VCC to generate a control signal PU. The power voltage detector 110 is configured to generate the control signal PU by detecting a rising state of the voltage value of the power voltage VCC during the power-on process. For example, when the voltage value of the power voltage VCC rises to be greater than a threshold value, the power voltage detector 110 sets the control signal PU to an enabled logic level, and enters a power-on read period. Here, the enabled logic level may be set by the designer, such as a logic level 1 or 0.

During the power-on read period, the power-on read circuit 100 performs a data reading operation on the memory cell array 101.

The voltage booster 120 is coupled to the power voltage detector 110. The voltage booster 120 receives the control signal PU and is activated when the control signal PU is at the enabled logic level, and is used to generate the boosted voltage VPPBGR. In this embodiment, the voltage booster 120 may be a charge pump, and when activated, the voltage booster 120 performs a voltage pumping operation based on a reference voltage, and generates the boosted voltage VPPBGR. In this embodiment, the boosted voltage VPPBGR is always higher than the power voltage VCC.

The boosted voltage VPPBGR and the power voltage VCC are supplied to the voltage selector 130. In this embodiment, the voltage selector 130 is configured to select one of the boosted voltage VPPBGR and the power voltage VCC to generate a selected voltage VSEL, and provide the selected voltage VSEL to the reference voltage generator 140 as the operating power source of the reference voltage generator 140. In detail, the voltage selector 130 selects the boosted voltage VPPBGR as the selected voltage VSEL during the power-on read period, and the voltage selector 130 selects the power voltage VCC as the selected voltage VSEL after the power-on read period.

The reference voltage generator 140 receives the control signal PU, and generates a reference voltage VREF based on the selected voltage VSEL according to the control signal PU. During the power-on process of the power voltage VCC, the voltage selector 130 may select the boosted voltage VPPBGR which is relatively high as the selected voltage VSEL. At this time, the reference voltage generator 140 may effectively generate the reference voltage VREF according to the selected voltage VSEL having a sufficiently high voltage value. In this embodiment, the reference voltage generator 140 may be an energy bandgap voltage generator.

On the other hand, the read voltage generator 150 generates a read voltage PORead according to the reference voltage VREF, the control signal PU, and a clock signal OSC. In detail, the read voltage generator 150 may perform a boosting operation according to the reference voltage VREF and the clock signal OSC, and generate a boosted voltage. The read voltage generator 150 generates the read voltage PORead based on the boosted voltage and the control signal PU. The read voltage generator 150 may generate the above boosted voltage through a charge pumping operation. In addition, the read voltage generator 150 may also boost the read voltage PORead to generate a shifted read voltage PORead'. The shifted read voltage PORead' is provided to the memory cell array 101 to perform a data reading operation on the memory cell array 101.

After the power-on reading operation is completed, the voltage selector 130 changes to select the power voltage VCC as the selected voltage VSEL.

In this embodiment, the power-on read circuit 100 may effectively perform the power-on reading operation based on the boosted voltage VPPBGR (e.g., equal to 2.1 volts) in applications with a low power voltage VCC (e.g., equal to 1.4 volts). That is, the power-on read circuit 100 of the embodiment of the disclosure may support an electronic device to effectively perform the power-on reading operation in applications under a low power voltage operation.

Figure 2:
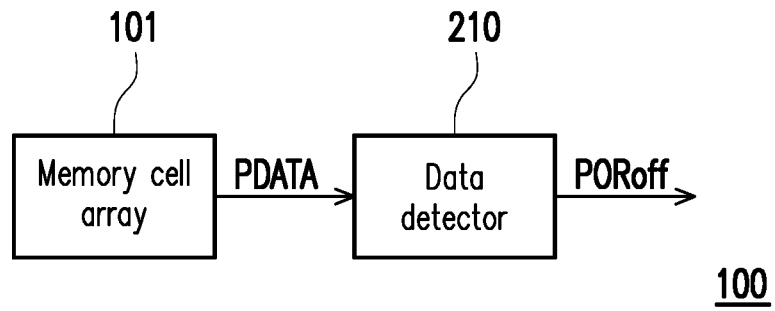
FIG. 2 and FIG. 4 are schematic diagrams of a part of the power-on read circuit according to different embodiments of the disclosure.

Hereinafter, referring to FIG. 2, FIG. 2 is a schematic diagram of a part of a power-on read circuit according to an embodiment of the disclosure. In FIG. 2, the power-on read circuit 100 further includes a data detector 210. The data detector 210 is coupled to the memory cell array 101 and configured to detect the read data RDATA read by the memory cell array 101 during the power-on reading operation. In the memory cell array 101, a tag indicating whether it is the last piece of data is placed within the data RDATA provided in the power-on reading operation. The data detector 210 may check each piece of read data RDATA, to determine whether there is a tag indicating the last piece of data. When the read data RDATA has a tag indicating the last piece of data, it indicates that the power-on reading operation has been completed, and the data detector 210 may generate a read end signal PORoff.

In the embodiment of FIG. 1, the read end signal PORoff may be provided to the voltage booster 120 to stop the operation of the voltage booster 120. In addition, the voltage selector 130 may also select the power voltage VCC or the boosted voltage VPPBGR according to the read end signal PORoff to generate the selected voltage VSEL. When the read end signal PORoff indicates that the power-on reading operation is not completed (during the power-on read period), the voltage selector 130 selects the boosted voltage VPPBGR to generate the selected voltage VSEL. On the contrary, when the read end signal PORoff indicates that the power-on reading operation has been completed (after the power-on read period), the voltage selector 130 selects the power voltage VCC to generate the selected voltage VSEL.

The data detector 210 may be constructed by a digital circuit, and the data detector 210 is configured to compare the tag in each piece of read data RDATA with the tag representing the last piece of data, and generate the read end signal PORoff according to the comparison result.

Figure 3:
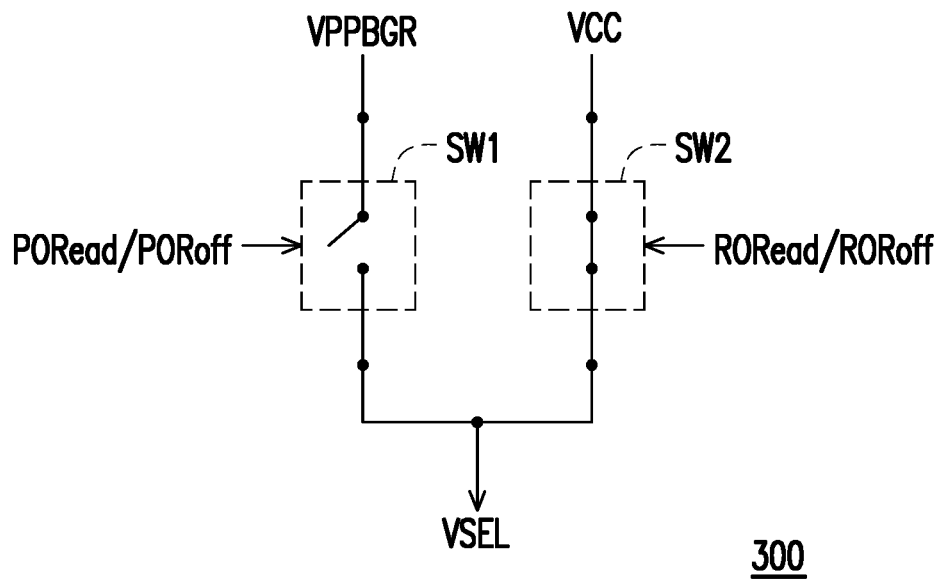
FIG. 3 is a schematic diagram illustrating an implementation of a voltage selector in a power-on read circuit according to an embodiment of the disclosure.

Referring to FIG. 3, FIG. 3 is a schematic diagram illustrating an implementation of a voltage selector in a power-on read circuit according to an embodiment of the disclosure. The voltage selector 300 includes switches SW1 and SW2. One terminal of the switch SW1 receives the boosted voltage VPPGBR, and the other terminal of the switch SW1 is coupled to the switch SW2 and provides the selected voltage VSEL. The terminal of the switch SW2 that is not coupled to the switch SW1 receives the power voltage VCC. The switches SW1 and SW2 are controlled by the read voltage PORead or the read end signal PORoff.

When the switches SW1 and SW2 are both controlled by the read voltage PORead, and when the read voltage PORead is at an enabled logic level, the switch SW1 is turned on and the switch SW2 is turned off. At this time, the switch SW1 selects the boosted voltage VPPGBR as the selected voltage VSEL. On the contrary, when the read voltage PORead is at the disabled logic level, the switch SW2 is turned on and the switch SW1 is turned off, and the switch SW2 selects the power voltage VCC as the selected voltage VSEL at this time.

When the switches SW1 and SW2 are both controlled by the read end signal PORoff, and when the read end signal PORoff is at a disabled logic level (indicating that the power-on reading operation has not been completed), the switch SW1 is turned on and the switch SW2 is turned off. At this time, the switch SW1 selects the boosted voltage VPPGBR as the selected voltage VSEL. On the contrary, when the read end signal PORoff is at the enabled logic level (indicating that the power-on reading operation has been completed), the switch SW2 is turned on and the switch SW1 is turned off, and the switch SW2 selects the power voltage VCC as the selected voltage VSEL at this time.

Figure 4:
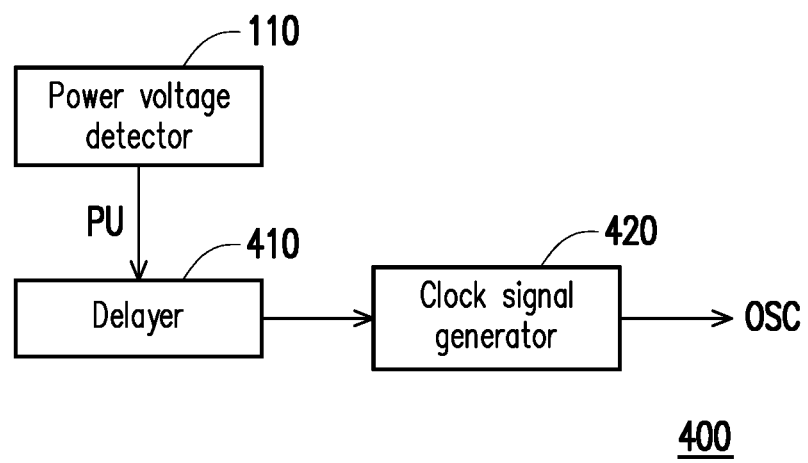

Referring to FIG. 1 and FIG. 4, FIG. 4 is a schematic diagram of a part of a power-on read circuit according to another embodiment of the disclosure. In FIG. 4, a power-on read circuit 400 further includes a delayer 410 and a clock signal generator 420. The delayer 410 may be coupled to the power voltage detector 110 in the embodiment of FIG. 1, and the delayer 410 is coupled to the clock signal generator 420. The clock signal generator 420 is configured to generate the clock signal OSC. The clock signal OSC is provided to the read voltage generator 150. The delayer 410 receives the control signal PU and is configured to delay the control signal PU. The activation time of the clock signal generator 420 is determined according to the output signal of the delayer 410. The delayer 410 generates the output signal by delaying the control signal PU. That is, the delayer 410 allows the clock signal generator 420 to be activated to generate the clock signal OSC after a delayed time after the control signal PU is enabled.

The foregoing delayed time ensures that the reference voltage generator 140 has effectively generated the reference voltage VREF. The clock signal generator 420 may generate the clock signal OSC correspondingly after the reference voltage VREF is effectively generated, so as to avoid the possibility of malfunction of the read voltage generator 150.

Figure 5:
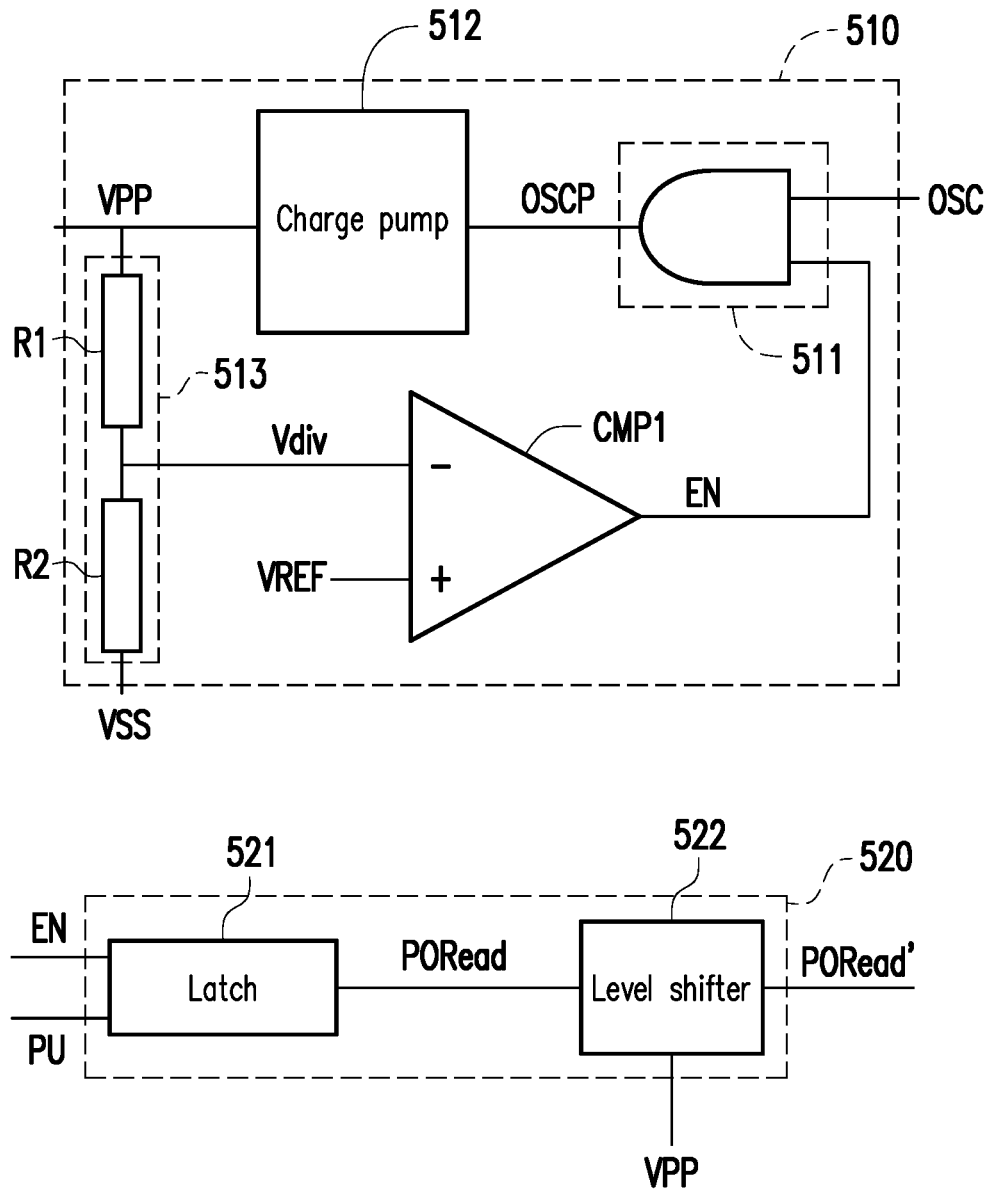
FIG. 5 is a schematic diagram illustrating an implementation of a read voltage generator of a power-on read circuit according to an embodiment of the disclosure.

Hereinafter, referring to FIG. 5, FIG. 5 is a schematic diagram illustrating an implementation of a read voltage generator of a power-on read circuit according to an embodiment of the disclosure. A read voltage generator 500 includes a voltage booster 510 and a read timing controller 520. The voltage booster 510 generates a boosted voltage VPP according to the reference voltage VREF and the clock signal OSC. The read timing controller 520 generates the read voltage PORead based on the boosted voltage VPP according to the control signal PU.

In this embodiment, the voltage booster 510 includes a comparator CMP1, a logic operator 511, a charge pump 512, and a voltage divider 513. The comparator CMP1 is configured to compare the reference voltage VREF and a divided voltage Vdiv to generate an enable signal EN. The comparator CMP1 may be implemented by an operational amplifier. The positive input terminal of the operational amplifier receives the reference voltage VREF, the negative input terminal of the operational amplifier receives the divided voltage Vdiv, and the output terminal of the operational amplifier generates the enable signal EN. The logic operator 511 is coupled to the comparator CMP1. The logic operator 511 determines whether to output the clock signal OSC according to the enable signal EN. When the enable signal EN indicates that the divided voltage Vdiv is lower than the reference voltage VREF, the logic operator 511 may output the clock signal OSC to the charge pump 512. On the contrary, when the enable signal EN indicates that the divided voltage Vdiv is not lower than the reference voltage VREF, the logic operator 511 stops the output of the clock signal OSC to the charge pump 512. In FIG. 5, the logic operator 511 may be implemented by using AND gates. In other embodiments of the disclosure, the logic operator 511 may also be implemented by using other types of logic gates, and there is no particular limitation.

When the charge pump 512 receives the clock signal OSC, the charge pump 512 may perform a voltage pumping operation according to the clock signal OSC, and generate a gradual step-up boosted voltage VPP. When the charge pump 512 does not receive the clock signal OSC, the voltage value of the boosted voltage VPP remains unchanged. The voltage divider 513 may be composed of resistors R1 and R2. The voltage divider 513 generates the divided voltage Vdiv by dividing the boosted voltage VPP. From the diagram in FIG. 5, it is not difficult to know that the comparator CMP1, the logic operator 511, the charge pump 512, and the voltage divider 513 control the generated boosted voltage VPP to a preset voltage value through a feedback mechanism.

On the other hand, the read timing controller 520 includes a latch 521 and a level shifter 522. The latch 521 receives the control signal PU and the enable signal EN. The latch 521 generates the read voltage PORead by latching the control signal PU according to the enable signal EN. The level shifter 522 boosts the voltage value of the read voltage PORead based on the boosted voltage VPP, and generates a shifted read voltage PORead'.

In this embodiment, the enable signal EN is used to indicate whether the divided voltage Vdiv is higher than the reference voltage VREF. When the divided voltage Vdiv is higher than the reference voltage VREF (indicating that the voltage value of the boosted voltage VPP is sufficiently high), the latch 521 may latch the control signal PU according to the enable signal EN, thereby generating the read voltage PORead. Also, since the voltage value of the boosted voltage VPP at this time is sufficiently high, the shifted read voltage PORead' generated by the level shifter 522 may have a sufficiently high voltage value to perform a data reading operation on the memory cell array.

Incidentally, the latch 521 may be implemented in any form, and is implemented as a latch circuit of logic signals well known to those skilled in the art. The level shifter 522 may be implemented by a low voltage to high voltage level shifter well known to those skilled in the art, and there is no certain limitation.

Figure 6:
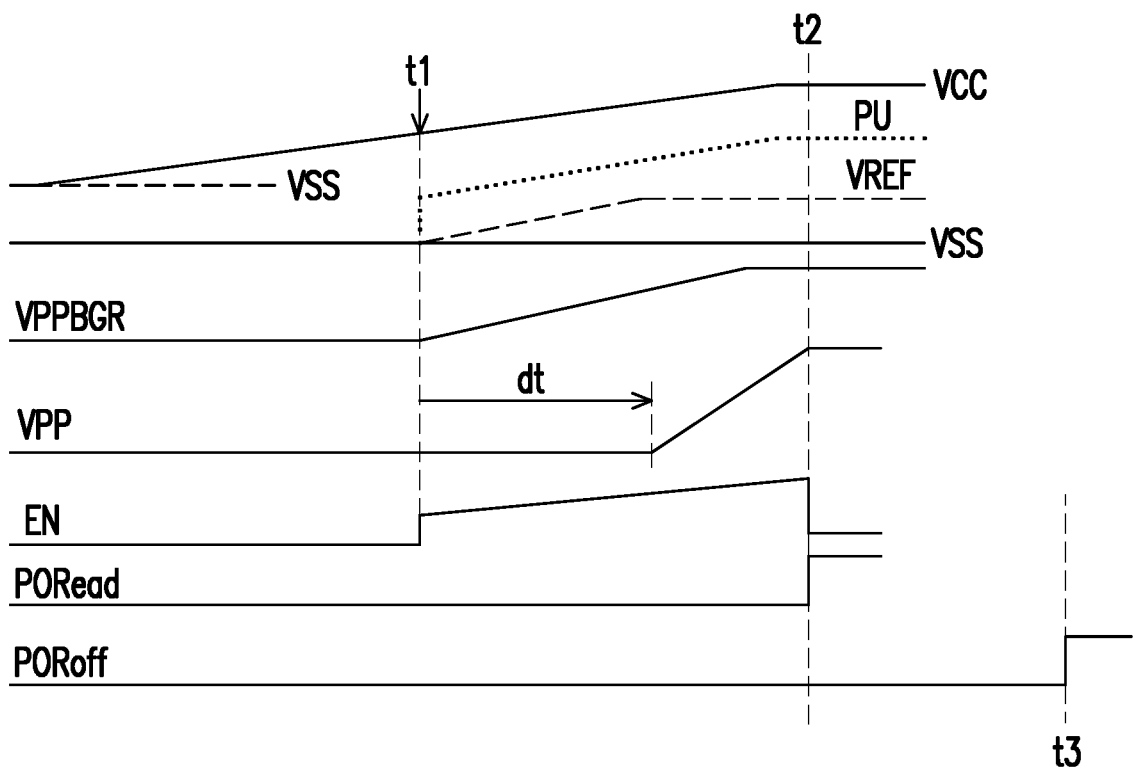
FIG. 6 is a waveform diagram illustrating the operation of the power-on read circuit according to the embodiment of the disclosure.

Referring to FIG. 1 and FIG. 6, FIG. 6 is a waveform diagram illustrating the operation of the power-on read circuit according to the embodiment of the disclosure. After the power voltage VCC is activated, the power voltage VCC may start rising from a reference ground voltage VSS. At a time point t1, the power voltage detector 110 may pull the control signal PU to a state of logic level 1 according to the voltage value of the power voltage VCC, and activate the power-on reading operation. At this time, since the power voltage VCC has not reached a stable state, the voltage value of the control signal PU may rise with the power voltage VCC.

Meanwhile, based on the enabled control signal PU, the voltage booster 120 may generate the boosted voltage VPPBGR, and provide the boosted voltage VPPBGR to the reference voltage generator 140. The reference voltage generator 140 generates the reference voltage VREF according to the boosted voltage VPPBGR.

After a delayed time dt following the time point t1, the reference voltage generator 140 may stably provide the reference voltage VREF, and the read voltage generator 150 may start generating the boosted voltage VPP. When the voltage value of the boosted voltage VPP reaches a predetermined target, the enable signal EN is pulled down to the logic level 0, and the control signal PU is latched to generate the read voltage PORead.

Then, at a time point t3, the data detector in the power-on read circuit 100 may determine that the last piece of data has been read, and correspondingly generate the read end signal PORoff, and end the power-on reading operation.

To sum up, the power-on read circuit of the disclosure may use a voltage booster to provide a boosted voltage during the power-on process of the power voltage, so that the boosted voltage may be used as the operating power source of the reference voltage generator, and the reference voltage generator may effectively generate a reference voltage when the power voltage is not sufficiently high. In this way, the read voltage generator may generate another boosted voltage according to the reference voltage, and generate the read voltage based on the boosted voltage. In this way, the data reading operation of the memory cell array may be effectively performed under the application of a low power voltage.

What is claimed is:

1. A power-on read circuit, comprising:
   a power voltage detector, detecting a voltage value of a power voltage to generate a control signal;
   a first voltage booster, generating a first boosted voltage according to the control signal;
   a voltage selector, selecting the power voltage or the first boosted voltage to generate a selected voltage;
   a reference voltage generator, receiving the selected voltage as an operating power source, and generating a reference voltage based on the selected voltage according to the control signal; and
   a read voltage generator, generating a second boosted voltage according to the reference voltage and a clock signal, and generating a read voltage based on the second boosted voltage according to the control signal, wherein the read voltage is provided to a memory cell array to perform a data reading operation.

2. The power-on read circuit according to claim 1, wherein the first voltage booster is a charge pump.

3. The power-on read circuit according to claim 1, wherein the voltage selector selects the first boosted voltage as the selected voltage during a power-on read period, and the voltage selector selects the power voltage as the selected voltage after the power-on read period.

4. The power-on read circuit according to claim 1, wherein the reference voltage generator is an energy bandgap voltage generator.

5. The power-on read circuit according to claim 3, wherein the first boosted voltage is higher than the power voltage.

6. The power-on read circuit according to claim 1, further comprising:
- a clock signal generator, generating the clock signal according to the control signal; and
- a delayer, coupled between the power voltage detector and the clock signal generator, and generating a delayed control signal by delaying the control signal, wherein the clock signal generator adjusts a time to generate the clock signal according to the delayed control signal.

7. The power-on read circuit according to claim 1, wherein the read voltage generator comprises:
- a second voltage booster, generating the second boosted voltage according to the reference voltage and the clock signal; and
- a read timing controller, generating the read voltage based on the second boosted voltage according to the control signal.

8. The power-on read circuit according to claim 7, wherein the second voltage booster comprises:
- a comparator, comparing the reference voltage and a divided voltage to generate an enable signal;
- a logic operator, determining whether to output the clock signal according to the enable signal;
- a charge pump, generating the second boosted voltage according to the clock signal; and
- a voltage divider, generating the divided voltage by dividing the second boosted voltage.

9. The power-on read circuit according to claim 8, wherein the logic operator performs an AND operation on the enable signal and the clock signal.

10. The power-on read circuit according to claim 8, wherein when the divided voltage is smaller than the reference voltage, the logic operator determines to output the clock signal according to the enable signal.

11. The power-on read circuit according to claim 8, wherein when the divided voltage is not smaller than the reference voltage, the logic operator stops outputting the clock signal according to the enable signal.

12. The power-on read circuit according to claim 7, wherein the read timing controller comprises:
- a latch, generating the read voltage by latching the control signal according to an enable signal; and
- a level shifter, boosting a voltage value of the read voltage based on the second boosted voltage.

13. The power-on read circuit according to claim 1, further comprising:
- a data detector, configured to detect whether a last piece of data is read, wherein when the last piece of data is read, the data detector generates a read end signal, wherein the first voltage booster stops providing the first boosted voltage according to the read end signal.

14. The power-on read circuit according to claim 1, wherein the data detector checks whether there is a tag in each piece of the read data to determine whether the last piece of data is read or not, wherein the tag indicates whether it is the last piece of data of the read data provided in the power-on reading operation.

15. The power-on read circuit according to claim 10, wherein the voltage selector selects the power voltage or the first boosted voltage according to the read voltage or the read end signal to generate the selected voltage.

16. The power-on read circuit according to claim 15, wherein the voltage selector comprises:
- a first switch having a first end receiving the first boosted voltage, and a control end of the first switch receiving the read voltage or the read end signal; and
- a second switch having a first end receiving the power voltage, a control end of the second switch receiving the read voltage or the read end signal, and a second end of the second switch is coupled to a second end of the first switch.

17. The power-on read circuit according to claim 16, wherein when both of the first switch and the second switch are controlled by the read voltage, the first switch is turned on and the second switch is turned off if the read voltage is at an enabled logic level; and when both of the first switch and the second switch are controlled by the read voltage, the first switch is turned off and the second switch is turned on if the read voltage is at a disabled logic level.

18. The power-on read circuit according to claim 16, wherein when both of the first switch and the second switch are controlled by the read end signal, the first switch is turned on and the second switch is turned off if the read end signal is at a disabled logic level; and when both of the first switch and the second switch are controlled by the read end signal, the first switch is turned off and the second switch is turned on if the read end signal is at an enabled logic level.

\* \* \* \* \*